United States Patent
Schrader et al.

(10) Patent No.: US 7,016,431 B2
(45) Date of Patent: Mar. 21, 2006

(54) TRANSMITTER FOR TRANSMITTING SIGNALS OVER RADIO CHANNELS AND METHOD FOR TRANSMITTING SIGNALS OVER RADIO CHANNELS

(75) Inventors: Marc Schrader, Hannover (DE); Mirko Lochau, Hildesheim (DE); Lars Harms, Hildesheim (DE); Nabil Hentati, Hannover (DE)

(73) Assignee: Robert Bosch GmbH, Stuttgart (DE)

( * ) Notice: Subject to any disclaimer, the term of this patent is extended or adjusted under 35 U.S.C. 154(b) by 659 days.

(21) Appl. No.: 09/914,134

(22) PCT Filed: Dec. 16, 2000

(86) PCT No.: PCT/DE00/04508

§ 371 (c)(1),
(2), (4) Date: Dec. 17, 2001

(87) PCT Pub. No.: WO01/48932

PCT Pub. Date: Jul. 5, 2001

(65) Prior Publication Data

US 2002/0168023 A1 Nov. 14, 2002

(30) Foreign Application Priority Data

Dec. 23, 1999 (DE) ................................ 199 62 341

(51) Int. Cl.
*H04L 25/03* (2006.01)

(52) U.S. Cl. ..................................................... 375/297
(58) Field of Classification Search ................ 375/296, 375/295, 297, 298, 308, 260, 261; 330/149; 455/114.3; 332/107, 123, 124, 125
See application file for complete search history.

(56) References Cited

U.S. PATENT DOCUMENTS

| 4,615,040 A | * | 9/1986 | Mojoli et al. | ................ 375/267 |
| 4,700,151 A | | 10/1987 | Nagata | ....................... 332/123 |

(Continued)

FOREIGN PATENT DOCUMENTS

DE        43 00 151        6/1993

(Continued)

OTHER PUBLICATIONS

C. Rapp, *Effects of HPA-Nonlinearity on a 4-DPSK/OFDM-Signal for a Digital Sound Broadcasting System,* Proc. of $2^{nd}$ European Conf. on Satellite Communications, Oct. 22, 1991.

(Continued)

*Primary Examiner*—Betsy L. Deppe
(74) *Attorney, Agent, or Firm*—Kenyon & Kenyon

(57) ABSTRACT

A transmitter for sending signals over wireless channels and a method of sending signals over wireless channels are described. The transmitter and the method are used to determine a transfer characteristic of an amplifier (8) in the transmitter. Test signals are input at preset times into OFDM signals to be transmitted, and then test signals amplified by the amplifier (8) are compared with test signals buffered in a measurement module (12) to determine the transfer characteristic of the amplifier (8). This transfer characteristic of the amplifier (8) is used by a predistorter (4) to predistort the signals according to this transfer characteristic. The test signal generated by a signal generator (13) is input into a synchronization symbol, with the amplitude of the test signal being increased incrementally or being large enough to determine the transfer properties of the amplifier (8). The test signal has an envelope which is not dependent on time.

6 Claims, 2 Drawing Sheets

U.S. PATENT DOCUMENTS

| | | | | |
|---|---|---|---|---|
| 5,262,734 A | * | 11/1993 | Dent et al. | 330/52 |
| 5,486,789 A | * | 1/1996 | Palandech et al. | 330/149 |
| 5,524,286 A | * | 6/1996 | Chiesa et al. | 455/126 |
| 5,598,436 A | * | 1/1997 | Brajal et al. | 375/297 |
| 5,732,333 A | * | 3/1998 | Cox et al. | 455/126 |
| 5,929,703 A | | 7/1999 | Sehier et al. | 330/149 |
| 5,937,011 A | * | 8/1999 | Carney et al. | 375/297 |
| 6,125,266 A | * | 9/2000 | Matero et al. | 455/126 |
| 6,166,601 A | * | 12/2000 | Shalom et al. | 330/151 |
| 6,252,912 B1 | * | 6/2001 | Salinger | 375/278 |
| 6,265,949 B1 | * | 7/2001 | Oh | 332/103 |

FOREIGN PATENT DOCUMENTS

| | | |
|---|---|---|
| WO | WO 00 60732 | 10/2000 |

OTHER PUBLICATIONS

Brajal et al., *Compensation of Nonlinear Distortions for Othogonal Multicarrier Schemes Using Predistortion,* Proc. of Global Telecommunications Conf., New York, IEEE, Nov. 28, 1994, pp. 1909-11.

* cited by examiner

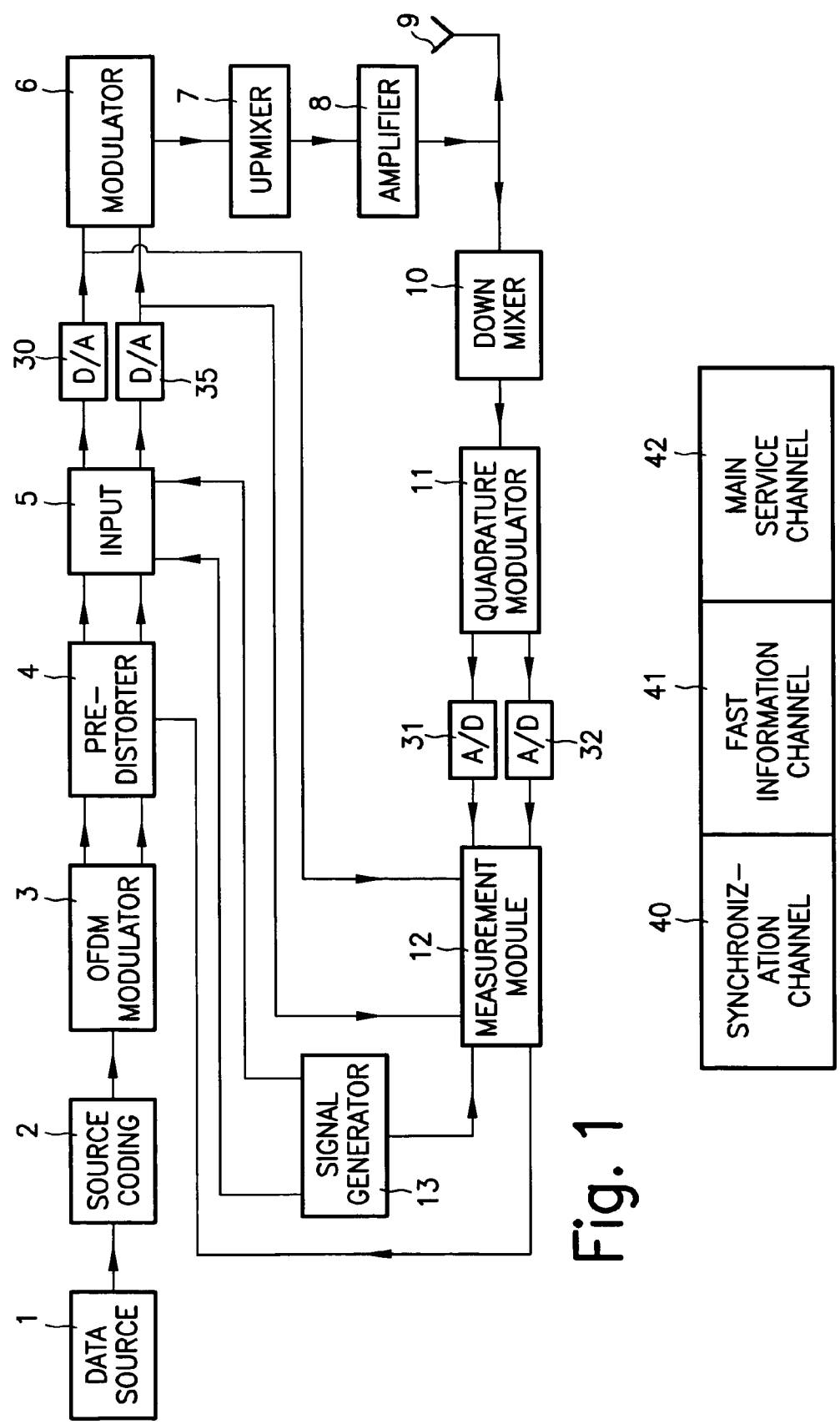

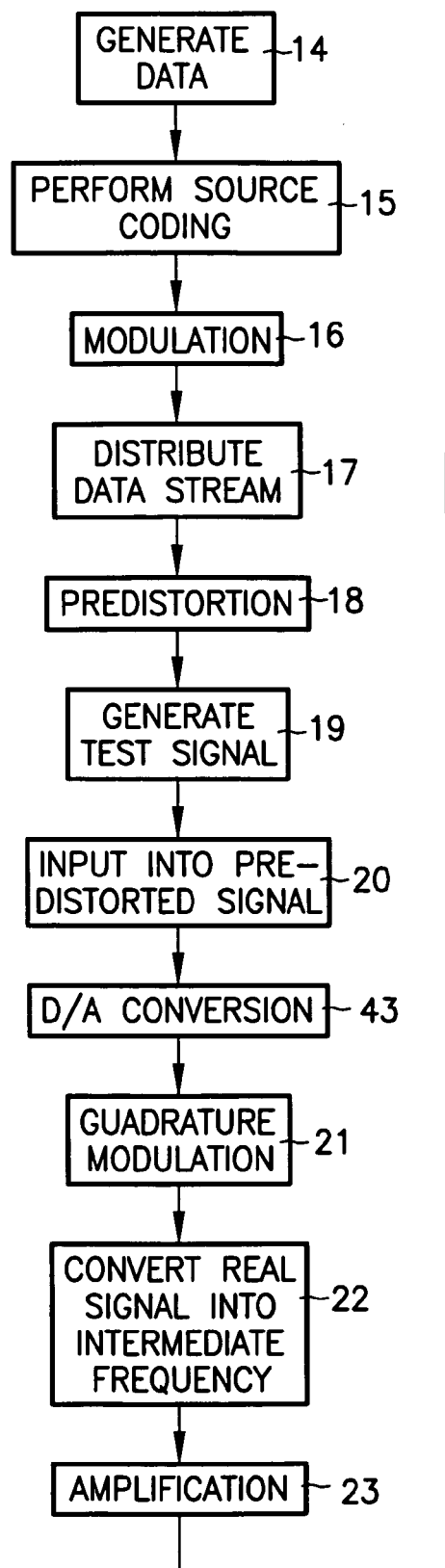
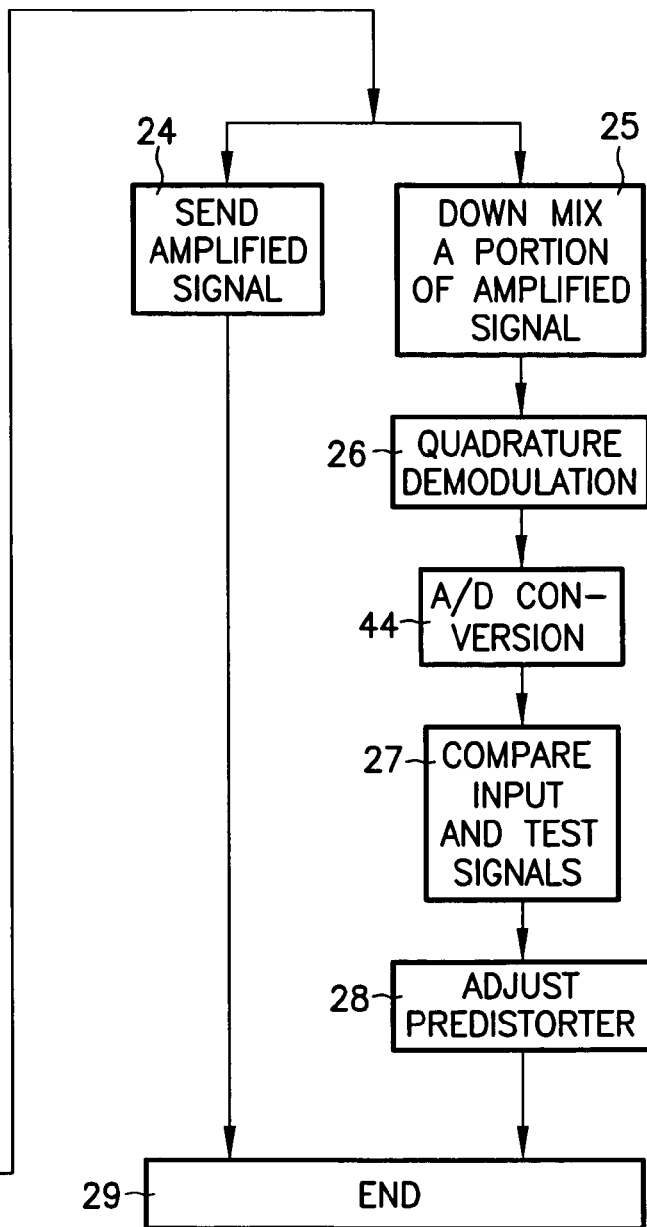
Fig. 3

US 7,016,431 B2

TRANSMITTER FOR TRANSMITTING SIGNALS OVER RADIO CHANNELS AND METHOD FOR TRANSMITTING SIGNALS OVER RADIO CHANNELS

BACKGROUND INFORMATION

The present invention is based on a transmitter for sending signals over wireless channels and a method of sending signals over wireless channels according to the definition of the species of the independent patent claims.

Predistortion of OFDM signals (OFDM=orthogonal frequency division multiplex), specifically according to the transfer properties of the amplifier in the transmitter, is already known from M. Schrader and N. Hentati "Reduktion von Außerbandstrahlung von Sendestufen im DAB-COFDM-System [Reducing out-of-band radiation of transmitter stages in the DAB-COFDM system]" OFDM Fachgespräche, September 1998, Braunschweig, printed in the conference volume. This is necessary because OFDM signals require good linearity of the amplifier in the transmitter due to the great difference between the large and small amplitudes occurring in OFDM signals, i.e., the dynamics or amplitude variance, because all OFDM signal amplitudes are to be amplified linearly. The article referenced above describes a feedback system for predistortion, where a portion of the amplified OFDM signal is fed back and compared with a buffered OFDM signal to determine the transfer properties of the amplifier in the transmitter. The buffered OFDM signal is the OFDM signal which is then amplified and fed back. Since the properties of the OFDM signal are very similar to those of a noise signal, this requires high-quality synchronization of the buffered OFDM signal and the amplified OFDM signal.

ADVANTAGES OF THE INVENTION

The transmitter according to the present invention for sending signals over wireless channels and the method according to the present invention of sending signals over wireless channels having the features of the independent patent claims has the advantage that a test signal is input into the OFDM signal to determine the transfer properties of the amplifier. This has the advantage that the complete transfer properties of the amplifier are determined, and thus better predistortion of the OFDM signals is possible.

Another advantage is that through the use of a suitable test signal, synchronization can be performed more easily with the feedback test signal and a buffered test signal.

Another advantage is that the test signal is only input at preset intervals, thus minimizing any negative effect on the signal sent due to this input.

Advantageous refinements of and improvements on the transmitter and the method characterized in the independent patent claims are possible through the measures characterized in the dependent claims.

It is especially advantageous that differential phase modulation, preferably differential quadrature phase shift keying, is used as the modulation method for imposing information on the OFDM signals. This has the advantage that the receiver need not determine an absolute phase but instead need only determine the phase shift between the signals for demodulation.

In addition, another advantage is that the test signal has an envelope which is not dependent on time. This minimizes the influence of the test signal on the measurement itself.

It is advantageous that the amplitude of the test signal is increased incrementally to determine the transfer properties of the amplifier. A transfer characteristic of the amplifier is thus determined incrementally.

Another advantage is that the test signal has an amplitude such that the control settings of the amplifier are fully adjusted with it. This saves time and bandwidth in determining the transfer characteristic. To then determine individual sections of the transfer characteristic, samples of this test signal are used to determine the transfer properties.

In addition, it is advantageous that the test signal is input into a synchronization symbol of the signals, so that no bandwidth is lost for useful data.

DRAWING

Embodiments of the present invention are illustrated in the drawing and are explained in greater detail in the following description.

FIG. 1 shows a block diagram of an OFDM transmitter according to the present invention;

FIG. 2 shows a DAB frame, and

FIG. 3 shows a method according to the present invention for sending signals over wireless channels.

DESCRIPTION OF EMBODIMENTS

Orthogonal frequency division multiplex (OFDM) is a well-known and successful method for mobile wireless applications. In OFDM, signals to be transmitted are distributed among multiple subcarriers, each subcarrier having a certain frequency interval from the others, so that the signals distributed among the subcarriers do not cause mutual interference. This is described as orthogonal.

OFDM is therefore used for digital wireless transmission methods, in particular for mobile reception, e.g., by way of car radios, including DAB (Digital Audio Broadcasting), DVB (Digital Video Broadcasting) and DRM (Digital Radio Mondial). These wireless transmission methods profit from the property of OFDM that, when frequency-selective damping occurs, only a small portion of the wireless signal transmitted has interference, because the wireless signal has been distributed among a plurality of frequencies and the only signal component containing interference is transmitted at a frequency at which there is strong damping. The signal component containing interference is corrected by error detecting and correcting measures. Such error detecting and correcting measures include error detecting and correcting codes such as block codes or convolution codes.

In OFDM, after the signals to be transmitted have been distributed among the subcarriers, they are added up in the time interval of the distributed signals, and the amplitudes may be added up in such a way that the amplitudes of the superimposed signal assume a very large value at certain times and also assume a very small value at other times. This depends on the phase relationship of the signal components being added, namely whether the signals are added constructively or destructively. An amplifier in the transmitter has the function of amplifying all amplitudes equally, so there is no nonlinear distortion.

Predistortion is used to take into account the transfer properties of the amplifier in the transmitter. To determine a transfer characteristic of the amplifier, a signal amplified by the amplifier must be compared with the original signal. The OFDM signal is a challenge due to the uncorrelated sequence of amplitudes occurring due to addition of the individual signal components, because it is difficult to synchronize the original OFDM signal with the amplified OFDM signal.

For amplification of OFDM signals, the amplifier should be operated only in the linear range. If a signal transmitted at a certain frequency is applied to a nonlinear characteristic curve, e.g., that of the amplifier, frequency components occur at multiples of this specific frequency. If these multiples are outside the transmission frequency spectrum, this is known as out-of-band radiation, because signal energy is then transmitted outside the available spectrum and is thus lost for the purposes of signal transmission because a receiver will filter out the out-of-band radiation. In addition, the out-of-band radiation will interfere with other transmission systems used at frequencies at which this out-of-band radiation occurs.

If there are new frequency components within the available transmission frequency spectrum, unwanted signal components are demodulated in the receiver. This results in crosstalk. This significantly worsens the signal quality and thus also the bit error rate of the received signal. The bit error rate indicates how many bits per received bit are detected incorrectly. Error detecting codes are used to determine the bit error rate. After distribution of the signals to be transmitted among the subcarriers, the OFDM signal is like a noise signal, individual amplitude peaks being able to drive the amplifier of the transmitter into the nonlinear range. Therefore, predistortion of the OFDM signal is necessary so that the characteristic curve of the amplifier will not have any effect on the spectrum of the OFDM signal.

FIG. 1 shows a block diagram of an OFDM transmitter according to the present invention. A data source 1 here serves to generate data. Data source 1 here is a microphone having electronics connected to it for amplifying and digitizing speech signals converted by the microphone. Microphone 1 converts sound waves into analog electric signals, which are amplified and digitized by electronic components connected to the microphone. The digital data stream generated from these speech signals leads to a source coding 2. This source coding 2 is performed by a processor.

Source coding 2 reduces the number of bits formed from the speech signals by having source coding 2 remove redundancy from the digital data stream. By using psychoacoustic models, data not necessary for reproduction of the speech signals is removed from the speech signals. After source coding 2, the data stream thus reduced is sent to an OFDM modulator 3. Moreover, in addition to speech signals, other data such as text data, image data and video data can also be transmitted. Then source coding is performed specifically for the given type of data.

OFDM modulator 3 first performs a differential phase modulation of the signals to be transmitted. Differential quadrature phase shift keying or DQPSK is used for this purpose. DQPSK is a digital modulation method in which the signal phase shift is modulated. The phase shift in a certain interval of time, i.e., per bit, is used as the modulation signal. A phase shift of ±90° is used here. Differential modulation methods have the advantage that no absolute value need be determined in the receiver to demodulate the signals because the information transmitted is contained in the phase shift of the signals transmitted. A bit string of 110 thus leads to a phase shift of +90° each for the two ones and −90° for the zero.

In addition to DQPSK, other differential and nondifferential phase modulation methods may also be used. However, it is also possible to use amplitude or frequency modulation methods here.

DQPSK is a complex modulation method because the bits of the bit stream carried in OFDM modulator 3 are mapped in phase shifts. If a phase of a signal is shifted, a complex plane is used for the graphic representation of the signals as vectors, a real component being on the abscissa and an imaginary component on the ordinate. A signal having a phase of >0 is rotated counterclockwise by this phase in the complex plane starting from the abscissa. If a 90° phase shift is performed four times, this leads back to the starting signal. Thus, four modulation states which can be differentiated mutually are possible with DQPSK.

In addition to differential QPSK, OFDM modulator 3 distributes the signals to be demodulated among the subcarriers, resulting in an OFDM signal. A complex signal is obtained as a result of DQPSK performed by OFDM modulator 3, so a first and a second data output of OFDM modulator 3 are connected to a first a and second data input of a predistorter 4 to separately process two components of the signal, the imaginary component and the real component.

Predistorter 4 distorts the signals coming from OFDM modulator 3 according to a transfer characteristic of amplifier 8. The transfer characteristic of amplifier indicates how the amplitudes and phases of the amplifier output signal vary as a function of the amplitudes of the amplifier input signal. Predistorter 4 inverts this characteristic to perform the predistortion, with a linear gain factor of amplifier 8 being calculated out, so that predistortion does not lead to damping of the signals coming from OFDM modulator 3. Predistorter 4 is implemented on a digital signal processor. The data regarding the characteristic of amplifier 8 is obtained by predistorter 4 via a third data input from a measurement module 12.

After predistorter 4, the predistorted signals go to an input 5. The signals are still complex, so that two data outputs lead from predistorter 4 to input 5. Input 5 inserts a test signal into the predistorted OFDM signal. Input 5 thus inserts the test signal into the OFDM signal at certain times, so that the test signal is available instead of the OFDM signal at these times. These times are preset, e.g., every hour or once a day. This measurement is performed before the actual operation of the transmitter according to the present invention and is then continued at preset times during operation of the transmitter.

In DAB, a zero symbol is provided for synchronization at the start of the DAB frame with which the DAB signals are transmitted. FIG. 2 shows a DAB frame. A synchronization channel 40 at the start of the DAB frame has the zero symbol. In a fast information channel 41, information regarding the multiplex and other service information is transmitted. A main service channel 42 has the data to be transmitted such as audio programs and/or multimedia data.

The test signal is input into this zero symbol so that no other data transmitted in the DAB frame is overwritten. It is acceptable for a synchronization symbol to overwrite the zero symbol of a DAB frame with a test signal because synchronization cannot be expected to stop after one frame because such input is relatively rare, as mentioned above. The test signal, which is also complex, is generated by a signal generator 13. Signal generator 13 has two data outputs leading to input 5. Input 5 thus receives the test signal from signal generator 13 over its third and fourth data inputs. Signal generator 13 is a conventional oscillator for generating sinusoidal oscillations. As an alternative, the test signal may also be input upstream from the predistorter. This point is explained in greater detail below.

The test signal must meet the following requirements. First, the test signal must not be filtered by a module of the amplifier; therefore, a very low frequency is used for the test signal. In addition, another condition is that the test signal has a constant envelope. The amplitudes of a test signal thus have the same value, so that the envelope, which is pulled from one maximum value to the next in the positive and negative ranges, is a parallel to the abscissa, which represents the time axis. This permits a simple determination of the transfer behavior of the amplifier by such a test signal. A sinusoidal oscillation exhibits such behavior.

The OFDM signal having the test signal input into it goes as a complex signal over the first and second data outputs from input 5 to one digital-analog converter 30 and 35, converting the components of the complex signal into analog signals which then go to a quadrature modulator 6. The complex OFDM signal having the test signal input into it is converted by quadrature modulator 6 into a real signal. Complex signal y(t) is described mathematically with the following equation:

$$y(t)=a(t)+jb(t)$$

and is converted to a real signal x(t) by the following procedure:

$$x(t)+a(t)\cos(\omega t)-b(t)\sin(\omega t)$$

where ω is a frequency by which the OFDM signal is converted to an intermediate frequency by upmixing.

Quadrature modulator 6 is followed by upmixer 7, with the real OFDM signal being converted to the intermediate frequency range. Upmixer 7 therefore has an oscillator to generate the frequency by which the OFDM signal is to be shifted.

The OFDM signal converted to the intermediate frequency is sent to amplifier 8 after upmixing 7, or it is amplified according to the transfer characteristic of amplifier 8. After amplifier 8, the OFDM signals go first to an antenna 9 which transmits them, and they also go to a downmixer 10 which reduces the amplified signal back to a baseband. This component of the OFDM signal is thus fed back. This component is of course very small in comparison with the component that is sent, for example, it may amount to less than one percent, because most of the signal energy is used for transmitting the OFDM signals. After feedback, the OFDM signal is output with a directional coupler. The directional coupler has two lines which are positioned so as to permit electromagnetic output of signal energy from one line to the other line.

The baseband is the frequency range in which data is generated. After downmixer 10, a complex signal is generated again from the real signal in a quadrature modulator, so that quadrature modulator 11 has two data outputs, one analog-digital converter 31 and 32 connected to each to digitize the complex signal components. The digitized signals then go to measurement module 12.

Over its first and second data inputs, measurement module 12 thus receives the OFDM signal with the input test signal amplified by amplifier 8. Over its third and fourth data inputs, measurement module 12 receives the OFDM signal having the input test signal from the first and second data outputs of input 5. The OFDM signal having the input test signal carried from input 5 to measurement module 12 is stored temporarily in measurement module 12 until the same OFDM signal having the input test signal is sent from quadrature demodulator 11 to measurement module 12. This permits a comparison of the input test signal upstream and downstream from amplifier 8. The transfer characteristic of amplifier 8 is determined by this comparison according to absolute value and phase as a function of the input amplitudes. To perform the synchronization, measurement module 12 is connected by its fifth data input to a third data output of signal generator 13, so that measurement module 12 is notified when a test signal is generated. Measurement module 12 has a data output connected to a second data input of predistorter 4, so that predistorter 4 predistorts signals coming from the OFDM modulator according to the transfer characteristic of amplifier 8 which has been sent. Measurement module 12 operates only when a test signal has been input. A processor controls signal generator 13 when the test signal is generated.

FIG. 3 shows a method according to the present invention for transmitting signals over wireless channels. Data is generated in step 14. This takes place by way of a microphone, as described above. However, other data sources are also possible, including a computer with a keyboard. Source coding is performed in step 15, with redundancy which is not necessary for reconstruction of the speech data in the receiver being removed from the speech signals. In step 16, modulation of the data stream after source coding 15 is performed, differential phase modulation being performed here as described above.

In step 17, the data stream is distributed among various subcarriers by OFDM modulation. In step 18, predistortion is performed according to the transfer characteristic of amplifier 8. In step 19, a test signal is generated. In step 20, the test signal is input into the predistorted OFDM signal at certain times, namely at the location of the zero symbol. In step 43, a digital-analog conversion of the OFDM signal having the test signal is performed. In step 21, quadrature modulation is performed to obtain a real signal from the complex signal.

In step 22, the real signal is converted into the intermediate frequency. In step 23, amplification of the converted signal is performed by amplifier 8. In step 24, the amplified signal is sent, while a portion of the amplified signal is again mixed down in step 25 and converted back to a complex signal a quadrature demodulator in step 26. Analog-digital conversion of the complex signal is performed in step 44, so that the same test signal that was input and the test signal sent through amplifier 8 can be compared in step 27 to determine the transfer characteristic of amplifier 8. If no test signal is input, the method ends here. In step 28 the predistorter is adjusted according to the transfer characteristic of amplifier 8 thus determined. The method ends with step 29.

The amplitude of the test signal which is input in various DAB frames is increased incrementally to completely run through the characteristic of amplifier 8. The entire transfer characteristic of amplifier 8 is thus determined.

As an alternative, a test signal having an envelope that is not constant is input into the OFDM signal. The envelope of the test signal is adjusted so that the control settings of amplifier 8 are fully adjusted. The transfer characteristic of amplifier 8 is determined by samples of this test signal.

In an alternative, the test signal can be input upstream from predistorter 4, in which case predistorter 4 is loaded with constant values, so that predistorter 4 then has a known effect on the signal which can be calculated out. Ideally, predistorter 4 does not then alter the signal.

What is claimed is:

1. A transmitter for sending a signal over a wireless channel, comprising:
    a modulator for modulating the signal to produce a modulated signal that is distributed over a subcarrier;
    a predistorter for predistorting the modulated signal distributed over the subcarrier according to an amplifier transfer property in order to produce a predistorted signal;
    a mixer for converting the predistorted signal from a baseband frequency into an intermediate frequency in order to produce a converted signal;
    an amplifier for amplifying the converted signal in order to produce an amplified signal;
    an antenna for sending a first portion of the amplified signal;
    a mixer for mixing a second portion of the amplified signal down from the intermediate frequency to the baseband frequency in order to produce a mixed-down signal;
    a measurement module for comparing the mixed-down signal with the predistorted signal to determine the amplifier transfer property and for notifying the predistorter of the amplifier transfer property;
    a signal generator for generating a test signal; and
    an input element for inputting at preset times the test signal into one of the modulated signal, the predistorted signal, and the converted signal, wherein:
        the measurement module compares the test signal in the mixed-down signal with the test signal in the one of the modulated signal, the predistorted signal, and the converted signal to obtain the amplifier transfer property, and
        the signal generator generates the test signal having an envelope that is not dependent on time.

2. A method for sending a signal over a wireless channel, comprising the steps of:
    modulating the signal to produce a modulated signal that is distributed over a subcarrier;
    predistorting the modulated signal distributed over the subcarrier according to an amplifier transfer property in order to produce a predistorted signal;
    converting the predistorted signal from a baseband frequency into an intermediate frequency in order to produce a converted signal;
    amplifying the converted signal in order to produce an amplified signal;
    sending a first portion of the amplified signal;
    mixing a second portion of the amplified signal down from the intermediate frequency to the baseband frequency in order to produce a mixed-down signal;
    comparing the mixed-down signal with the predistorted signal to determine the amplifier transfer property and for providing a notification of the amplifier transfer property;
    generating a test signal;
    inputting at preset times the test signal into one of the modulated signal, the predistorted signal, and the converted signal;
    comparing the test signal in the mixed-down signal with the test signal in the one of the modulated signal, the predistorted signal, and the converted signal to obtain the amplifier transfer property; and
    incrementally increasing an amplitude of the test signal up to a preset size to measure a control range of an amplifier.

3. The method according to claim 2, further comprising the step of:
    inputting the test signal into a synchronization symbol.

4. A method for sending a signal over a wireless channel, comprising the steps of:
    modulating the signal to produce a modulated signal that is distributed over a subcarrier;
    predistorting the modulated signal distributed over the subcarrier according to an amplifier transfer property in order to produce a predistorted signal;
    converting the predistorted signal from a baseband frequency into an intermediate frequency in order to produce a converted signal;
    amplifying the converted signal in order to produce an amplified signal;
    sending a first portion of the amplified signal;
    mixing a second portion of the amplified signal down from the intermediate frequency to the baseband frequency in order to produce a mixed-down signal;
    comparing the mixed-down signal with the predistorted signal to determine the amplifier transfer property and for providing a notification of the amplifier transfer property;
    generating a test signal;
    inputting at preset times the test signal into one of the modulated signal, the predistorted signal, and the converted signal; and
    comparing the test signal in the mixed-down signal with the test signal in the one of the modulated signal, the predistorted signal, and the converted signal to obtain the amplifier transfer property,
    wherein an amplitude of the test signal has a size such that control settings of an amplifier are at least fully adjusted by the test signal.

5. The method according to claim 4, further comprising the step of:
    determining the amplifier transfer property in accordance with samples of the test signal.

6. The method according to claim 5, further comprising the step of:
    inputting the test signal into a synchronization symbol.

* * * * *

UNITED STATES PATENT AND TRADEMARK OFFICE
CERTIFICATE OF CORRECTION

| | |
|---|---|
| PATENT NO. | : 7,016,431 B2 |
| APPLICATION NO. | : 09/914134 |
| DATED | : March 21, 2006 |
| INVENTOR(S) | : Schrader et al. |

It is certified that error appears in the above-identified patent and that said Letters Patent is hereby corrected as shown below:

On the title page item 57 (Abstract), delete (8), (8), (12), (8), (8), (4), (13), and (8).

Column 1, line 6, insert --FIELD OF THE INVENTION
    The present invention relates to a transmitter for sending signals over wireless channels and a method of sending signals over wireless channels--

Column 1, delete lines 8-11.

Column 1, line 36, change "ADVANTAGES OF THE INVENTION" to --SUMMARY OF THE INVENTION--

Column 1, lines 41-42, change "wireless channels having the features of the independent patent claims has" to --the wireless channels have--

Column 1, delete lines 54-57.

Column 2, line 15, change "DRAWING" to --BRIEF DESCRIPTION OF THE DRAWINGS--

Column 2, delete lines 17-19.

Column 2, line 21, change "the present invention;" to --the present invention--

Column 2, line 22, change "a DAB frame; and" to --a DAB frame.--

Column 2, line 26, change "DESCRIPTION OF THE EMBODIMENTS" to --DETAILED DESCRIPTION--

Column 3, lines 28-29, change "signal is necessary" to --signal is performed--

Column 4, line 23, change "characteristic of amplifier" to --characteristic of the amplifier--

UNITED STATES PATENT AND TRADEMARK OFFICE
CERTIFICATE OF CORRECTION

PATENT NO.       : 7,016,431 B2
APPLICATION NO.  : 09/914134
DATED            : March 21, 2006
INVENTOR(S)      : Schrader et al.

It is certified that error appears in the above-identified patent and that said Letters Patent is hereby corrected as shown below:

Column 5, line 1, change "The test signal must meet" to --The test signal meets--

Column 5, line 2, change "must not be filtered" to --is not filtered--

Signed and Sealed this

Eighteenth Day of March, 2008

JON W. DUDAS
*Director of the United States Patent and Trademark Office*